(12) United States Patent
Yu et al.

(10) Patent No.: US 6,596,591 B1
(45) Date of Patent: Jul. 22, 2003

(54) METHODS TO FORM REDUCED DIMENSION BIT-LINE ISOLATION IN THE MANUFACTURE OF NON-VOLATILE MEMORY DEVICES

(75) Inventors: Allen S. Yu, Fremont, CA (US); Chau M. Ho, San Mateo, CA (US); Paul J. Steffan, Elk Grove, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 76 days.

(21) Appl. No.: 09/739,733

(22) Filed: Dec. 18, 2000

(51) Int. Cl.$^7$ .............................. H01L 21/336
(52) U.S. Cl. ....................... 438/264; 438/593
(58) Field of Search ................ 438/221, 225, 438/296, 297, 585, 947, 264, FOR 219, 593; 430/432

(56) References Cited

U.S. PATENT DOCUMENTS

| | | | |
|---|---|---|---|
| 5,252,433 A | * | 10/1993 | Fujioka et al. |
| 5,470,767 A | * | 11/1995 | Nakamoto et al. |
| 5,550,007 A | * | 8/1996 | Taylor et al. |
| 5,759,911 A | * | 6/1998 | Cronin et al. |
| 5,783,342 A | * | 7/1998 | Yamashita et al. |
| 6,013,551 A | * | 1/2000 | Chen et al. |
| 6,046,085 A | * | 4/2000 | Chan |
| 6,100,014 A | * | 8/2000 | Lin et al. |
| 6,350,675 B1 | * | 2/2002 | Chooi et al. |

* cited by examiner

Primary Examiner—George Fourson
Assistant Examiner—Joannie Adelle Garcia

(57) ABSTRACT

A method of manufacturing a semiconductor device with a reduced bit-line isolation dimension. After a layer of image sensitive photoresist is patterned and developed with openings having the minimum printable dimension, the layer of photoresist is silylated causing the layer of photoresist to swell, which causes the opening dimension to decrease.

5 Claims, 5 Drawing Sheets

METHODS TO FORM REDUCED DIMENSION BIT-LINE ISOLATION IN THE MANUFACTURE OF NON-VOLATILE MEMORY DEVICES

BACKGROUND OF THE INVENTION

1. Field of the Invention

This invention relates generally to the manufacture of high performance semiconductor devices. More specifically, this invention relates to the manufacture of high performance semiconductor non-volatile memory devices. Even more specifically, this invention relates to the manufacture of high performance semiconductor non-volatile memory devices with reduced bit-line separation.

2. Discussion of the Related Art

In standard semiconductor manufacturing, the manufacture of non-volatile memory devices, Local Oxidation of Silicon (LOCOS) isolation or Shallow Trench Isolation (STI) has been commonly used to form the "bit-line" isolation. Later in the process flow, an anisotropic etch of the first layer of polysilicon provides the bit-line separation of the floating gates. Due to tight geometry, a critical resist mask is required to separate the first polysilicon layer above the isolation. This mask layer is very critical because it is required to print the smallest "space" within the boundary of the isolation pillar. The term "space" is defined as the open region in the imaging layer, the photoresist. The open region exposes the first layer of polysilicon and thus allows the transfer of the imaging layer onto the first layer of polysilicon to form the floating gate. Without the use of expensive lithographic illuminating source, new photoresist, and phase-shift mask to print the minimum feature, it is impossible to reduce the dimension of the spacing. The difficulty of forming this critical layer has been remedied by the increase in a dimension of the isolation pillar. This suggests that density has been compromised. Moreover, this ever-small feature size may outstrip the alignment envelope of the most advanced tool available.

Therefore, what is needed is a method to reduce the bit-line separation for non-volatile memory devices below the minimum printable dimension available from current photolithographic equipment.

SUMMARY OF THE INVENTION

According to the present invention, the foregoing and other objects and advantages are obtained by a method reducing features in a semiconductor device below the minimum printable dimension available from the photolithographic system in use.

In accordance with a first aspect of the invention, isolation structures are formed in a semiconductor substrate, a layer of tunnel oxide is formed on the surface of the semiconductor substrate between the isolation structures and a first layer of polysilicon forming a bitline is formed on the surface of the tunnel oxide. A layer of image sensitive photoresist is formed on the surface of the device, patterned and developed to form openings having a dimension of $X_1$ in the layer of photoresist exposing portions of the underlying first layer of polysilicon. The layer of image sensitive photoresist is silylated, which causes the photoresist to swell thus causing the openings having a dimension of $X_1$ to shrink to a dimension of $X_2$.

In accordance with another aspect of the invention, the remaining layers of silylated and non-silylated photoresist are removed and the exposed portions of the first layer of polysilicon are anisotropically etched down to the surface of the underlying isolation structures. A conformal layer of ONO is formed on the surface of the device and a second layer of polysilicon is formed on the surface of the layer of ONO forming a wordline.

The described method thus provides a method of manufacturing a semiconductor device having reduced dimension bit-line isolation and reduces the effects of misalignment of the photoresist patterning mask.

The present invention is better understood upon consideration of the detailed description below, in conjunction with the accompanying drawings. As will become readily apparent to those skilled in the art from the following description, there is shown and an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment or specific embodiments of the present invention that illustrate the best mode or modes presently contemplated by the inventors for practicing the invention.

Figure 1A:
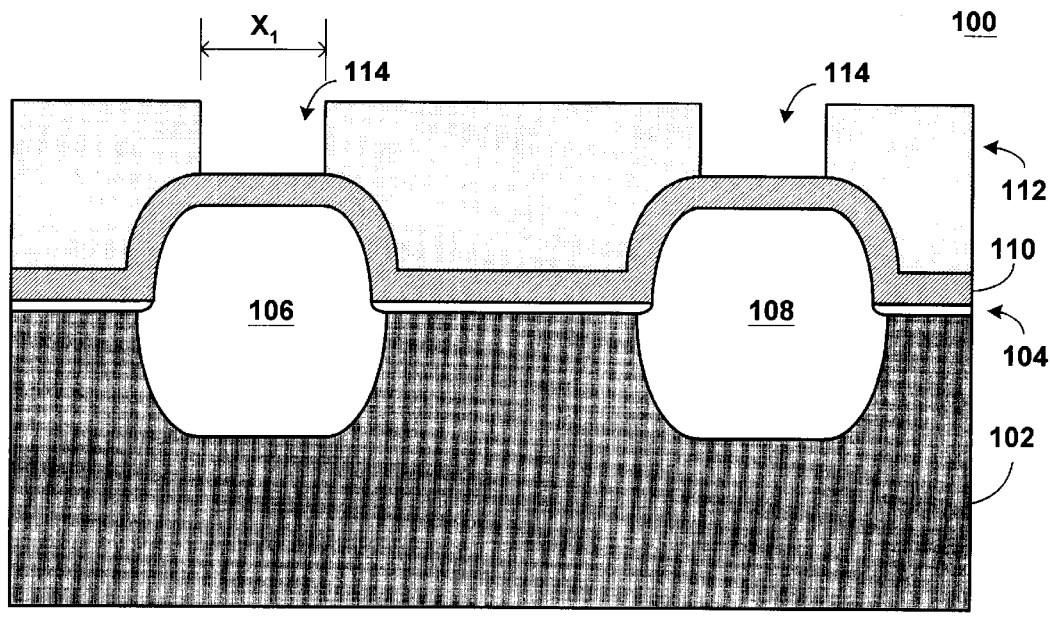
FIGS. 1A & 1B show a first method of forming bit-line isolation in the manufacture of a non-volatile memory device with perfect alignment.

FIG. 1A shows a portion 100 of a non-volatile memory device. The portion 100 includes a layer of silicon substrate 102, a layer of tunnel oxide 104, field oxide structures 106 & 108 and a conformal layer 110 of polysilicon formed over the layer of tunnel oxide 104 and the field oxide structures 106 & 108. An imaging layer 112 of photoresist is spun formed on the surface of the layer 110 and the layer 112 of photoresist is patterned and developed by exposure to an alkaline solution that forms openings 114 having a minimum printable dimension of $X_1$. The openings 114 expose portions of the layer 110 of polysilicon having the dimension $X_1$.

Figure 1B:
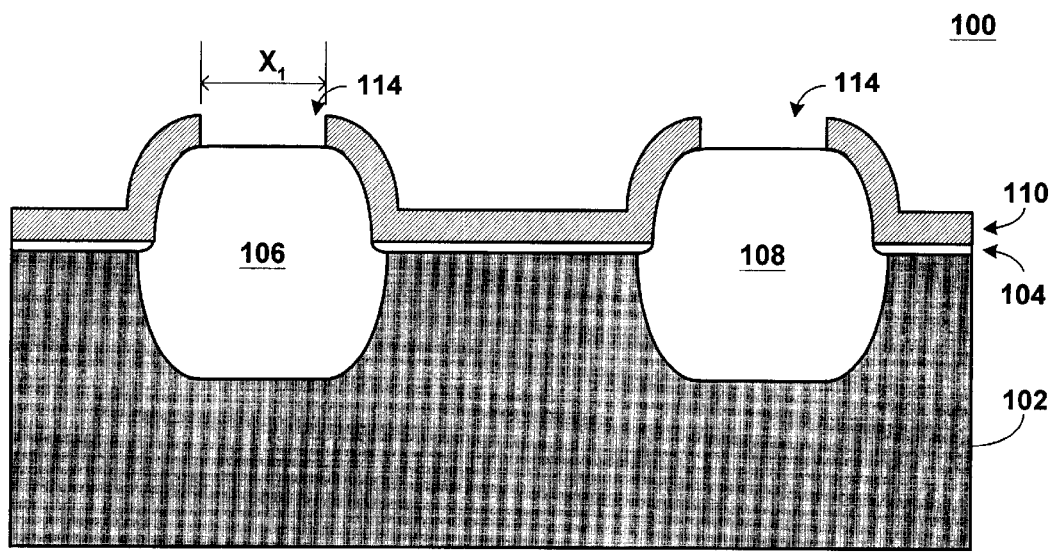

FIG. 1B shows the portion 100 of a non-volatile memory device as shown in FIG. 1A with the remaining portions of the imaging layer 112 of photoresist removed after an anisotropic etch has removed the exposed portions of the layer 110 of polysilicon. Note that because the pattern to develop the layer 112 of resist was aligned perfectly, that the openings 114 expose portions of the field oxide structures 106 & 108 that are substantially in the middle of the structures 106 & 108.

Figure 2A:
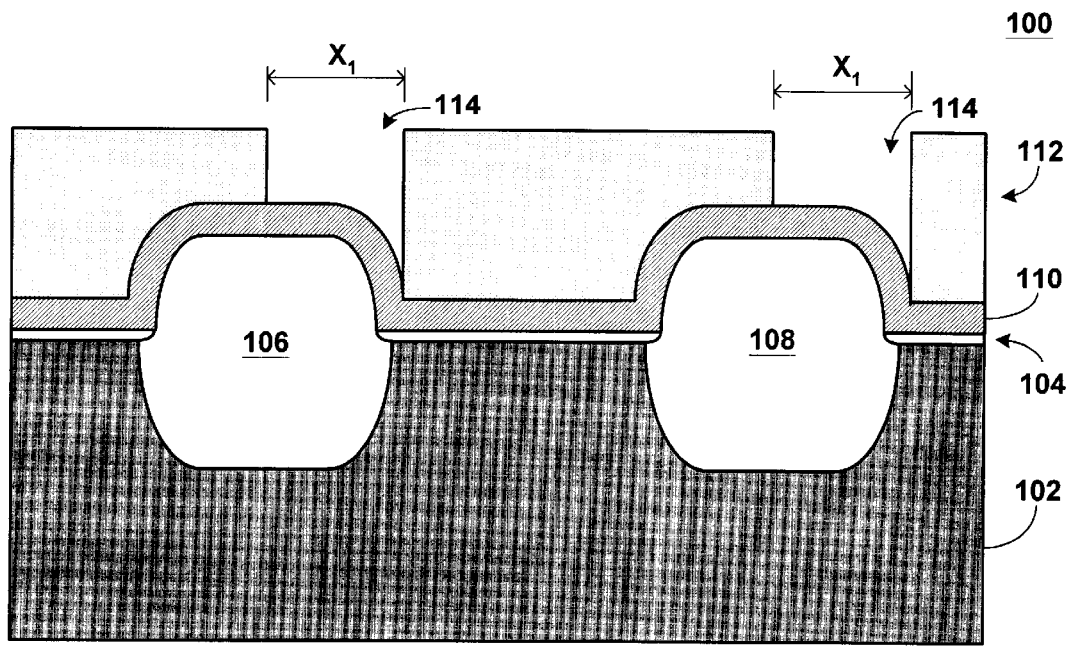
FIGS. 2A & 2B show the first method of forming bit-line isolation in the manufacture of a non-volatile memory device as shown in FIGS. 1A & 1B with non-perfect alignment.

FIG. 2A shows the portion 100 of a non-volatile memory device as shown in FIG. 1A with the pattern developed in the imaging layer 112 of photoresist misaligned. The openings 114 formed in the layer 112 of photoresist also have the minimum printable dimension $X_1$.

Figure 2B:
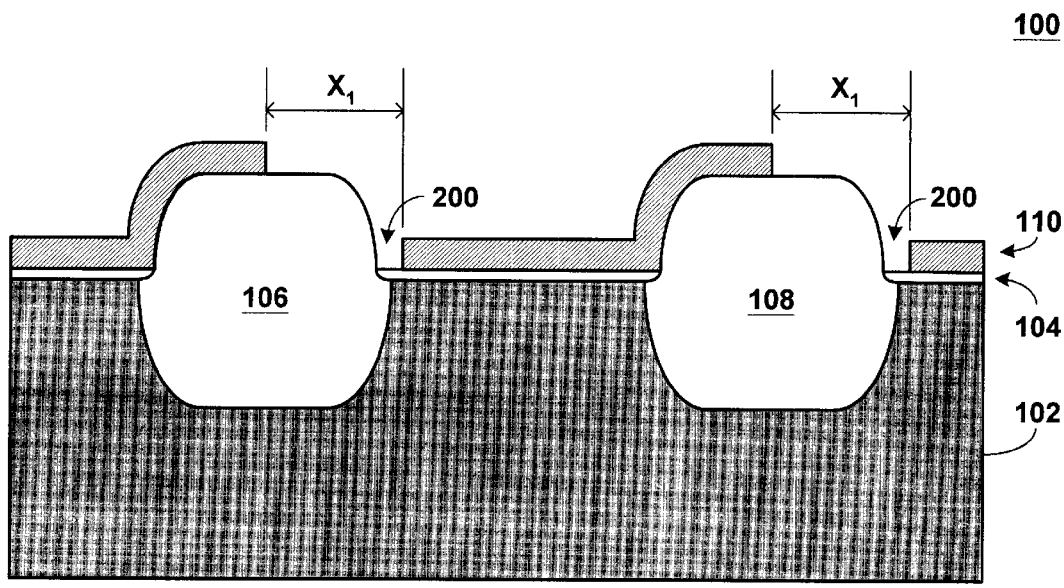

FIG. 2B shows the portion 100 of a non-volatile memory device as shown in FIG. 2A with the remaining portions of the imaging layer 112 of photoresist removed after an anisotropic etch has removed the exposed portions of the layer 110 of polysilicon. Because the pattern to which the imaging layer 112 is exposed is misaligned, the anisotropic etch process exposes active portions 200 of the device and will cause the device to fail.

Figure 3A:
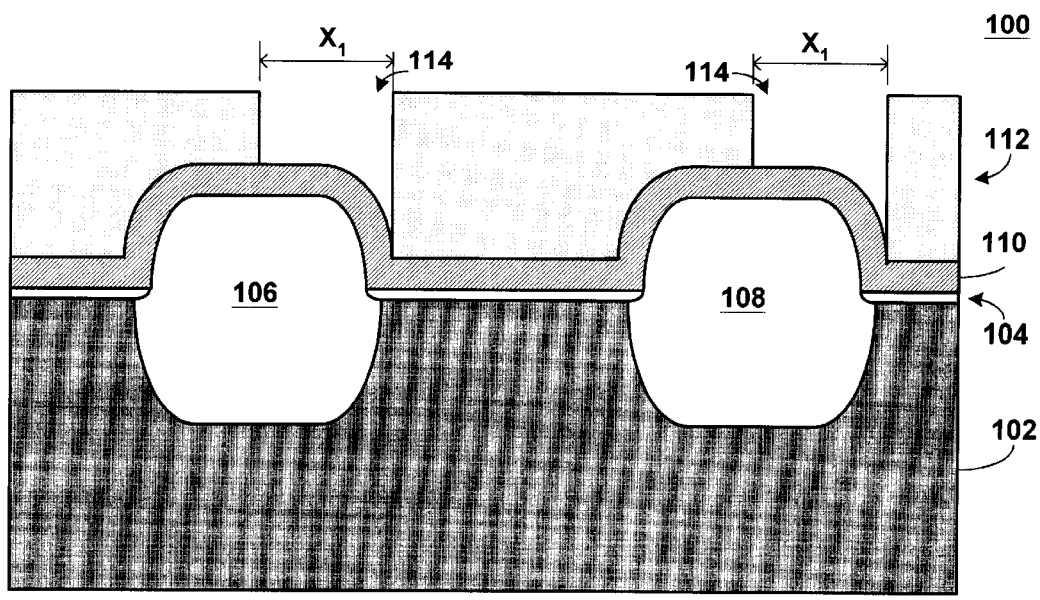
FIGS. 3A–3F show a second method of forming bit-line isolation in the manufacture of a non-volatile memory device showing both perfect alignment and non-perfect alignment.

FIG. 3A shows the portion 100 of a non-volatile memory device as shown in FIG. 2A with the reasonable amount of misalignment of the imaging layer 112 as shown in FIG. 2A. The openings 114 have the minimum printable dimension $X_1$ as shown in FIG. 2A.

Figure 3B:
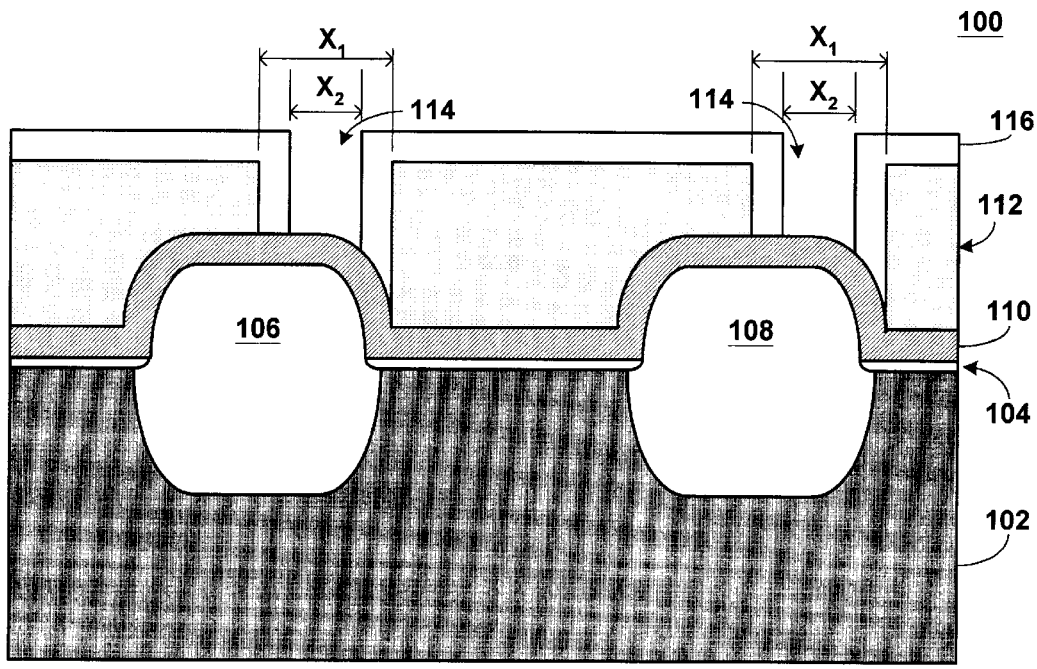
Figure 3C:
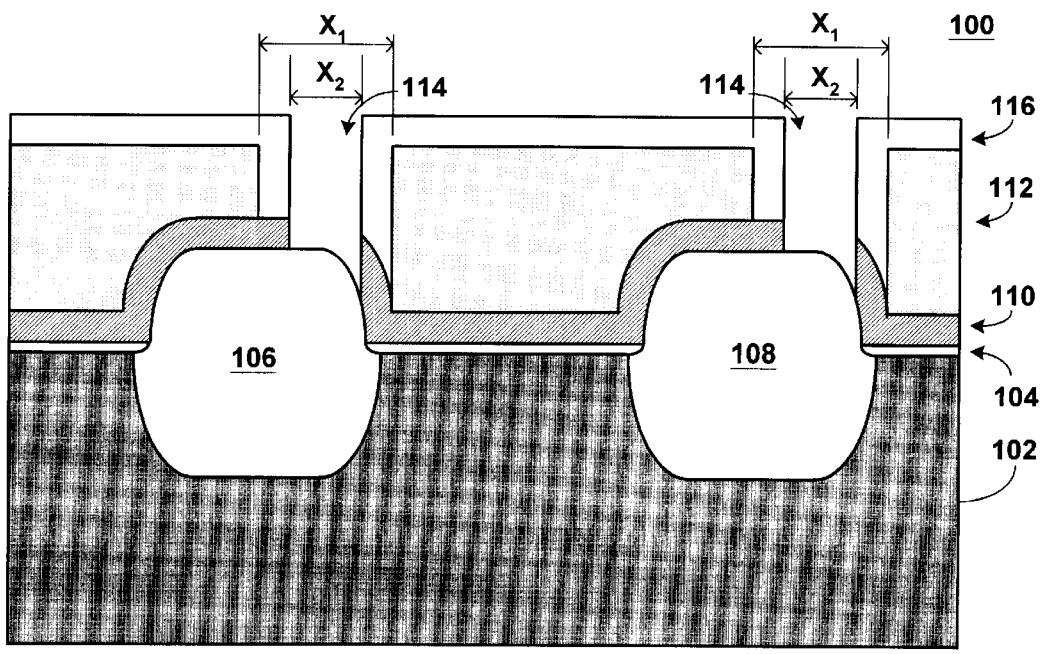

FIG. 3B shows the portion 100 of a non-volatile memory device as shown in FIG. 3A after the unexposed resist pattern in the imaging layer 112 of photoresist has been treated in an HMDS vapor to form a layer 116 of silylated resist. The thickness of the silylated resist is controlled by the length of time the imaging layer 112 of photoresist is exposed to the HMDS vapor and the temperature during the exposure. The formation of the silylation resist causes the imaging layer to swell as discussed in U.S. Pat. No. 5,906, 911 to Cote. The swelling reduces the dimension of the openings 114 from $X_1$ to $X_2$. The wafer is then treated to $O_2$ reactive ion etching to form a hard mask or etched as is to form a smaller bit-line as is shown in FIG. 3C below. According to the process disclosed in C. Garza, et al., "Manufacturability issues of the DESIRE process," *SPIE Advances in Resist Technology and Processing*, VI 1086, pp. 229–237 (1989) is similar. The article states that a resist that is a combination of novolac-resin/diazoquinone-sensitizer, is spin coated onto a substrate. The resist is then selectively exposed to energy. The article theorizes that the diazoquinone decomposed in the exposed region and that this brought about chemical changes in the resist that favored the incorporation of HMDS (hexamethyldisilazane) in these regions. Thus, when the resist was exposed to radiation, heated to cause cross linking in unexposed regions, and then treated with a vapor containing HMDS, the HMDS was selectively incorporated into the exposed regions of the resist. The resist was then subjected to a dry etch, such as $O_2$ reactive ion etching.

FIG. 3C shows the portion 100 of a non-volatile memory device as shown in FIG. 3B after an anisotropic etch process that removes exposed portions of the layer 110 of polysilicon down to the field oxide structures 106 and 108.

Figure 3D:
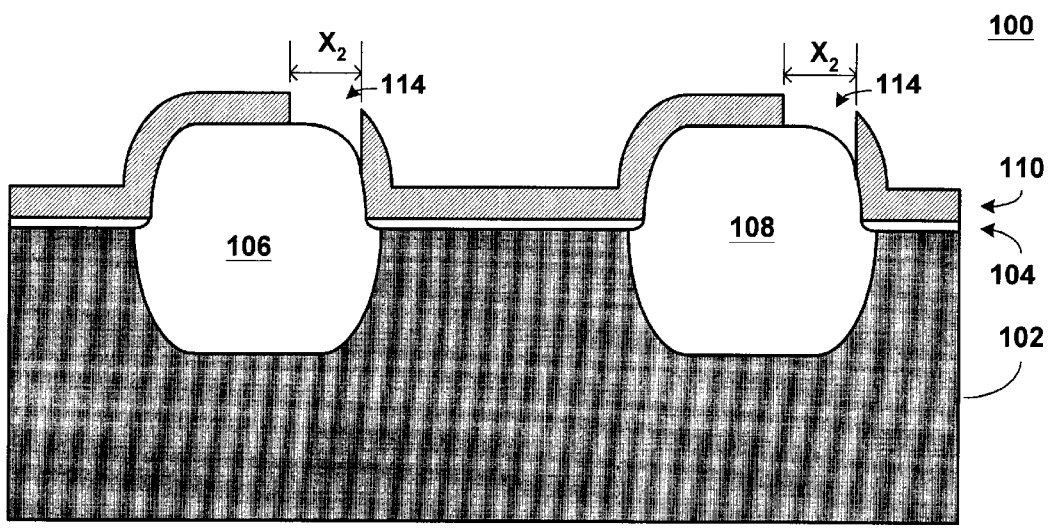

FIG. 3D shows the portion 100 of a non-volatile memory device as shown in FIG. 3C with the remaining portions of the layer 116 of silylated resist and remaining portions of the layer 112 of unsilylated resist removed. It should be noted that the structure as shown in FIG. 3D corresponds to the structure as shown in FIG. 2B where both structures were started with the same printable dimension $X_1$ and the structure in FIG. 2B would fail because the etch process exposes active portions 200 in FIG. 2B and a subsequent formation of a layer of polysilicon which forms a wordline to couple with the active portion 200 and cause the failure.

Figure 3E:
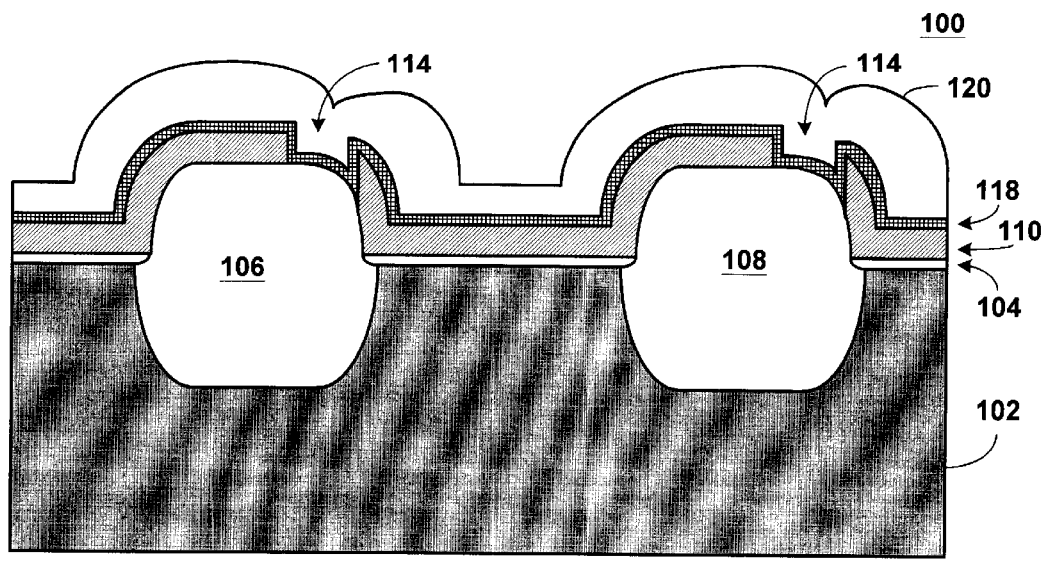

FIG. 3E shows the portion 100 of a non-volatile memory device as shown in FIG. 3D with a conformal layer 118 of oxide-nitride-oxide (ONO) formed on the surface of the portion 100 of the device. A layer 120 of polysilicon forming wordlines is shown formed on the conformal layer 118 of oxide-nitride-oxide.

Figure 3F:
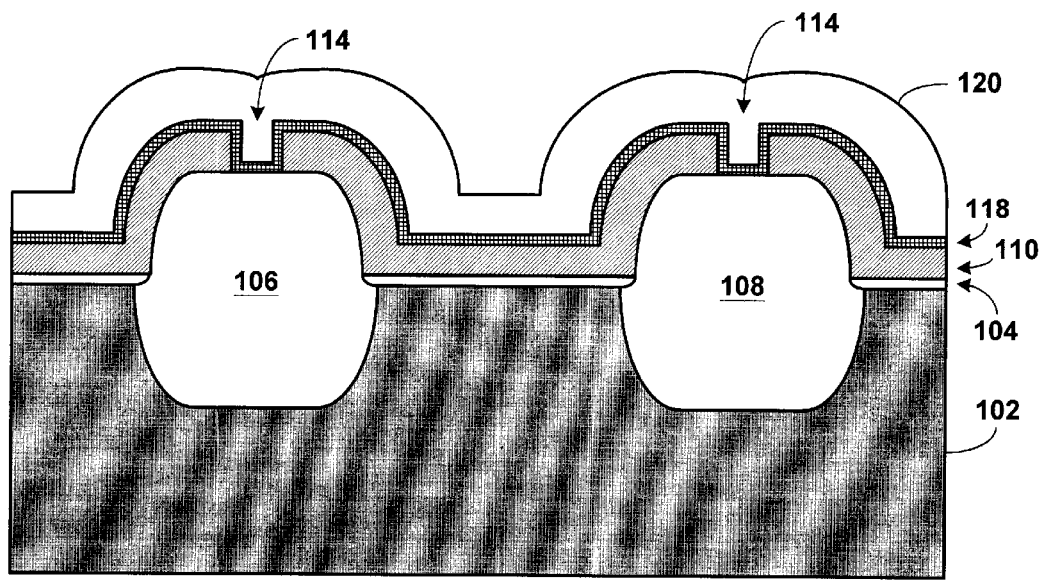

FIG. 3F is substantially the same as FIG. 3E but shows the portion 100 of a non-volatile memory device resulting from a substantially perfect alignment of the imaging layer 112 as shown in FIG. 1A.

In summary, the described method provides a method of manufacturing a semiconductor device having reduced dimension bit-line isolation and reduces the effects of misalignment of the photoresist patterning mask.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor, the method comprising:

(d) forming isolation structures in a semiconductor substrate, wherein surface areas of the semiconductor substrate between the isolation structures are formed;

(e) forming a layer of tunnel oxide on each of the surface areas;

(f) forming a first conformal layer of polysilicon on a surface area of the layer of tunnel oxide and on a surface area of each of the isolation structures, wherein the first conformal layer of polysilicon forms a continuous layer;

(g) forming a layer of image sensitive photoresist on the first conformal layer of polysilicon;

(h) patterning and developing the layer of image sensitive photoresist, wherein openings having a dimension are formed in the layer of image sensitive photoresist exposing portions of the first conformal layer of polysilicon;

(i) forming a layer of silylated resist on the layer of image sensitive photoresist, wherein the layer of silylated resist swells causing the openings having a dimension of $X_1$ to have a dimension of $X_2$, wherein $X_2$ is less than $X_1$ whereby the exposed portions of the first conformal layer of polysilicon have a dimension of $X_2$; and (j) anisotropically etching the exposed portions of the first conformal layer of polysilicon, wherein said photoresist is treated with a HMDS vapor to form said layer of silylated resist and wherein the thickness of said silylated resist is controlled by the length of time an imaging layer of said photoresist is exposed to said HMDS vapor during exposure.

2. The method of claim 1 wherein said photoresist is subjected to reactive ion etching.

3. The method of claim 1 wherein exposed portions of said polysilicon are removed by an anisotropic etch to reveal field oxide structures.

4. The method of claim 1 further comprising:

(a) removing remaining portions of the layers of silylated and non-silylated photo resist;

(b) forming a conformal layer of ONO on a surface of the device; and (c) forming a conformal layer of a second layer of polysilicon on the surface of the device.

5. The method of claim 4 wherein a word line is formed from polysilicon that is formed on said conformal layer.

* * * * *